(12) United States Patent
Shen et al.

(10) Patent No.: US 8,711,617 B2
(45) Date of Patent: Apr. 29, 2014

(54) DATA MODULATION FOR GROUPS OF MEMORY CELLS

(75) Inventors: Zhenlei Shen, Boise, ID (US); William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 223 days.

(21) Appl. No.: 13/152,637

(22) Filed: Jun. 3, 2011

(65) Prior Publication Data

US 2012/0307559 A1 Dec. 6, 2012

(51) Int. Cl.
*G11C 11/34* (2006.01)
*G11C 16/04* (2006.01)

(52) U.S. Cl.
USPC .................................................. 365/185.03

(58) Field of Classification Search
USPC .................................................. 365/185.03
See application file for complete search history.

(56) References Cited

U.S. PATENT DOCUMENTS

| | | | | |
|---|---|---|---|---|
| 6,646,913 | B2 * | 11/2003 | Micheloni et al. | 365/185.03 |
| 6,816,407 | B2 * | 11/2004 | Rolandi | 365/185.03 |
| 6,847,550 | B2 * | 1/2005 | Park | 365/185.03 |
| 7,167,109 | B2 * | 1/2007 | Hu et al. | 341/56 |
| 7,590,005 | B2 | 9/2009 | Hsu et al. | |
| 7,760,548 | B2 | 7/2010 | Widjaja | |
| 7,848,142 | B2 | 12/2010 | Radke | |
| 7,848,158 | B2 | 12/2010 | Moschiano et al. | |
| 2008/0151621 | A1 * | 6/2008 | Kong et al. | 365/185.03 |
| 2009/0109747 | A1 * | 4/2009 | Radke | 365/185.03 |
| 2010/0322005 | A1 | 12/2010 | Dong et al. | |

* cited by examiner

*Primary Examiner* — Vanthu Nguyen
(74) *Attorney, Agent, or Firm* — Brooks, Cameron & Huebsch, PLLC

(57) ABSTRACT

Methods, devices, and systems for data modulation for groups of memory cells. Data modulation for groups of memory cells can include modulating N units of data to a combination of programmed states. Each memory cell of a group of G number of memory cells can be programmed to one of M number of programmed states, where M is greater than a minimum number of programmed states needed to store N/G units of data in one memory cell, and where the programmed state of each memory cell of the group is one of the combination of programmed states.

18 Claims, 5 Drawing Sheets

US 8,711,617 B2

DATA MODULATION FOR GROUPS OF MEMORY CELLS

TECHNICAL FIELD

The present disclosure relates generally to semiconductor memory devices, methods, and systems, and more particularly, to voltage modulation for fractional bits per memory cell.

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory. Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

Memory cells in an array architecture can be programmed to a desired state. That is, electric charge can be placed on or removed from the floating gate of a memory cell to put the cell into a number of stored states. For example, a single level cell (SLC) can represent two data states as represented by the binary units 1 or 0. Flash memory cells can also store more than two data states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multiunit cells, or multilevel cells (MLCs). MLCs can allow the manufacture of higher density memories without increasing the number of memory cells since each cell can represent more than one digit, e.g., more than one bit.

MLCs can have more than one programmed state, e.g., a cell capable of representing two digits can have four programmed states, a cell capable of representing three digits can have eight program states, and a cell capable of representing four digits can have sixteen programmed states. Thus, MLCs can have $2^B$ programmed states, where B is equal to the number of binary digits that can be stored in the cell. Conventionally, the programmed states directly represent data states. For example, a cell that can store two binary digits can be programmed to one of four programmed states directly corresponding to one of four data states, such as 11, 01, 10, and 00.

DETAILED DESCRIPTION

Figure 1:
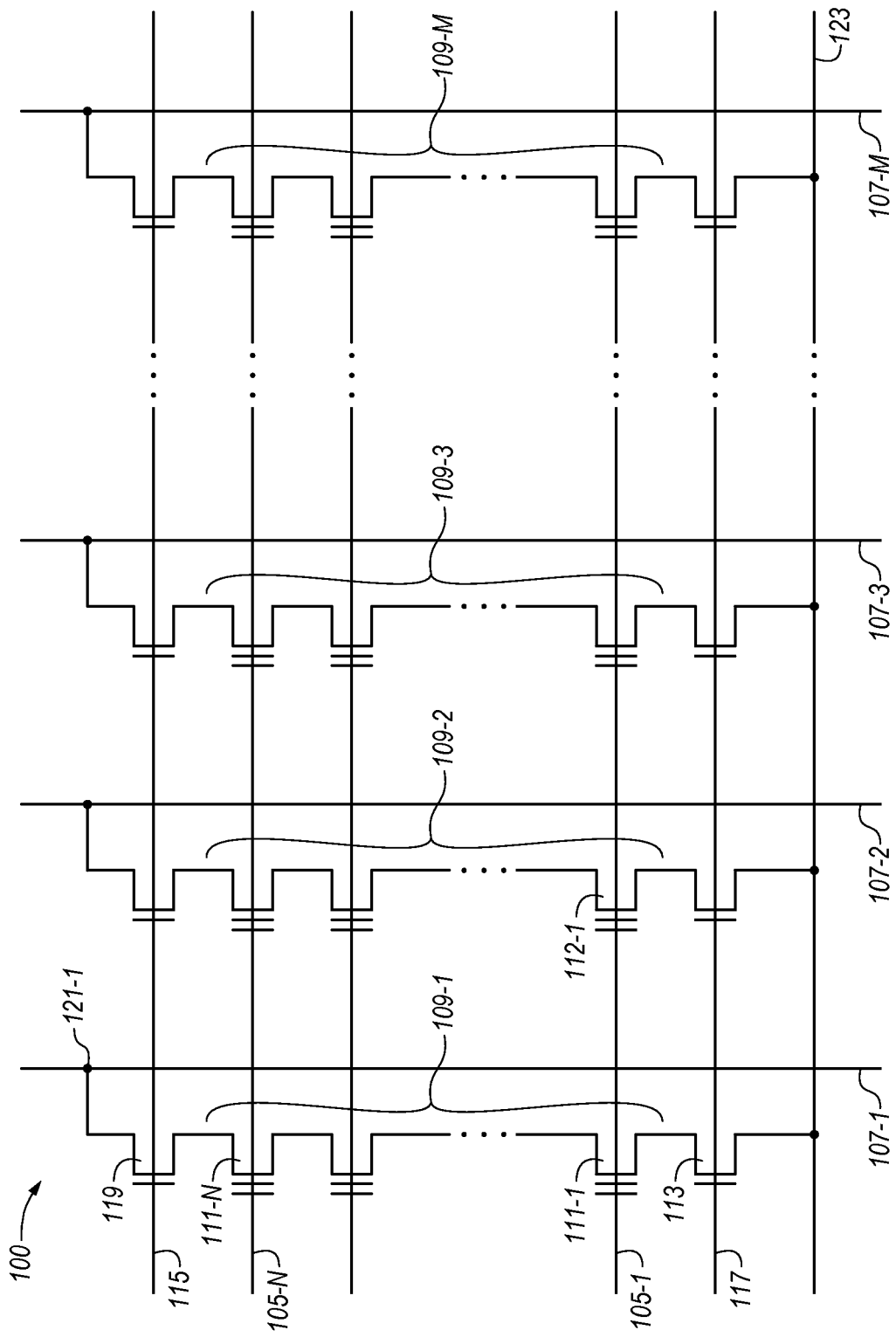
FIG. 1 illustrates a schematic diagram of a portion of a non-volatile memory array in accordance with a number of embodiments of the present disclosure.

The present disclosure includes methods, devices, and systems for data modulation for groups of memory cells. One method for data modulation for groups of memory cells can include modulating N units of data to a combination of programmed states. Each memory cell of a group of G number of memory cells can be programmed to one of M number of programmed states, where M is greater than a minimum number of programmed states needed to store N/G units of data in one memory cell, and where the programmed state of each memory cell of the group comprises one of the combination of programmed states.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicates that a number of the particular feature so designated can be included with a number of embodiments of the present disclosure. As used herein, "a number" of something can refer to one or more of such things.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 500 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, . . . 105-N and intersecting data lines, e.g., local bit lines 107-1, 107-2, 107-3, . . . , 107-M. For ease of addressing in the digital environment, the number of word lines 105-1, . . . 105-N and the number of local bit lines 107-1, 107-2, 107-3, . . . 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, construction of the non-volatile memory cells 111-1, . . . , 111-N includes a source, a drain, a charge storage node such as a floating gate, and a control gate. The non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a page of memory cells. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, program state.

A sensing operation, such as a read or program verify operation, can include sensing a voltage and/or current change of a bit line coupled to a selected cell in order to determine the state of the selected cell. The sensing operation can involve providing a voltage to, e.g., biasing, a bit line, e.g., bit line 107-1, associated with a selected memory cell above a voltage, e.g., bias voltage, provided to a source line, e.g., source line 123, associated with the selected memory cell. A sensing operation could alternatively include pre-charging the bit line 107-1 followed with discharge when a selected cell begins to conduct, and sensing the discharge.

Sensing the state of a selected cell can include providing a number of sensing signals, e.g., read voltages, to a selected word line while providing a number of pass signals, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

In a number of embodiments of the present disclosure, a memory cell can be programmed to one of a number of threshold voltage levels corresponding to either an integer or fractional number of bits. For example, a cell could store 2½ bits by being programmed to one of six or to one of eight programmed states as described in more detail herein. In order to output an integer number of bits, data from an even number of cells storing 2½ bits could be combined by logic in control circuitry, e.g., a fractional bit controller. For example, in the embodiment illustrated in FIG. 1, data from cells 111-1 and 112-1, each storing a number of bits with a ½ fractional remainder, (e.g., 2½ bits), which are coupled to sense lines 107-1 and 107-2, could be combined by logic in control circuitry to output an integer number of bits.

Figure 2:
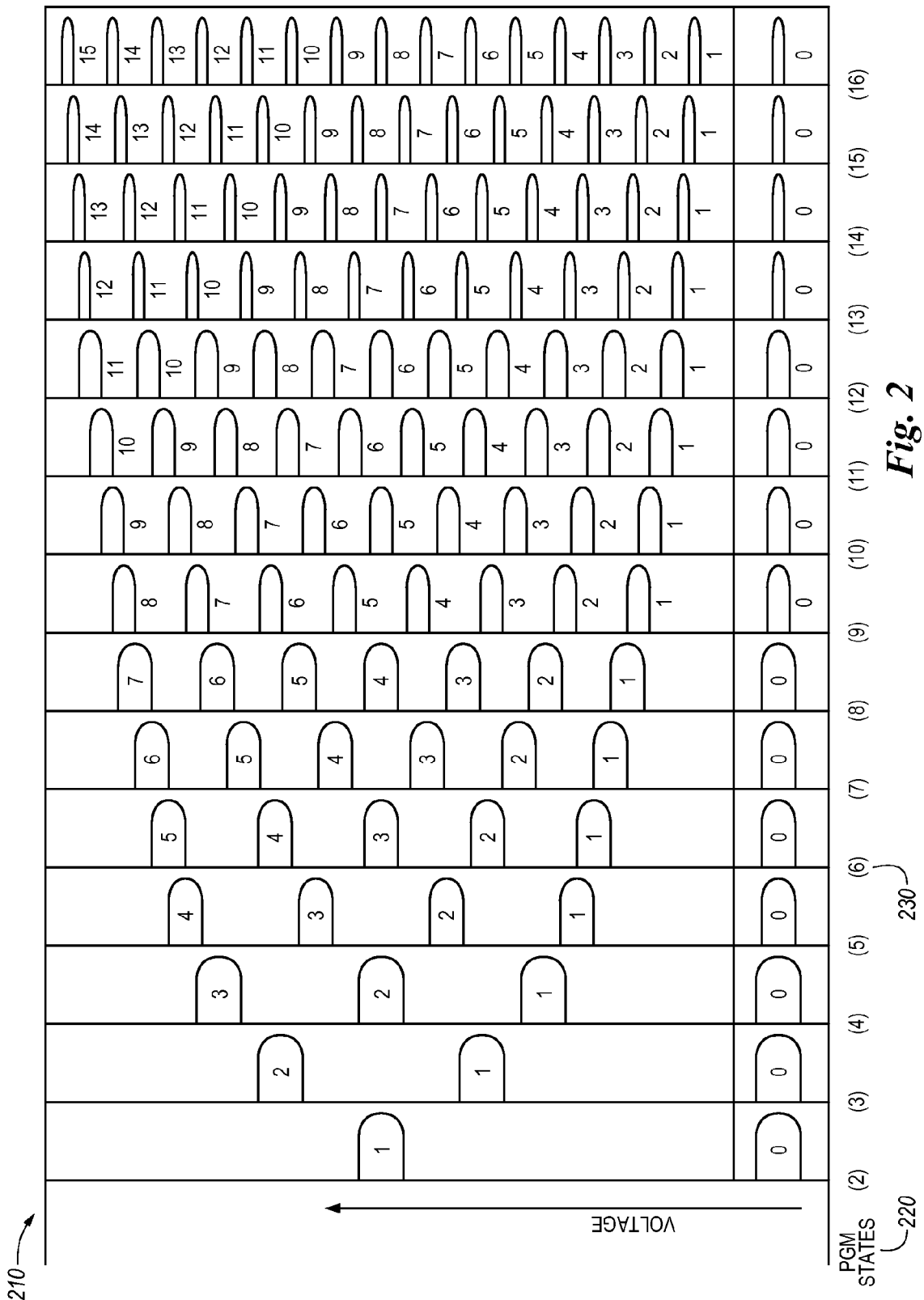
FIG. 2 illustrates a diagram of a number of threshold voltage levels for a memory device in accordance with a number of embodiments of the present disclosure.

FIG. 2 illustrates a diagram 210 of a number of threshold voltage levels for a memory device in accordance with a number of embodiments of the present disclosure. As indicated, the vertical axis represents an increasing charge, e.g., voltage, level. Embodiments of the present disclosure are not limited to a particular voltage range for a memory device. For example, some flash memory devices operate in a voltage range of −2V to +3V.

Row 220 indicates a number of programmed states to which the memory cell may be programmed, e.g., corresponding to the number of threshold voltage levels. A memory cell that can be programmed to one of two different programmed states can store one unit, e.g., bit, of data. A memory cell that can be programmed to one of three different programmed states can store 1½ units of data. A memory cell that can be programmed to one of four different programmed states can store 1½ or 2 units of data. A memory cell that can be programmed to one of five different programmed states can store 2¼ units of data. A memory cell that can be programmed to one of six different programmed states can store 2½ units of data. A memory cell that can be programmed to one of seven different programmed states can store 2¾ units of data. A memory cell that can be programmed to one of eight different programmed states can store 2½ or 3 units of data. A memory cell that can be programmed to one of nine different programmed states can store 3⅛ units of data. A memory cell that can be programmed to one of ten different programmed states can store 3¼ units of data. A memory cell that can be programmed to one of eleven different programmed states can store 3⅜ units of data. A memory cell that can be programmed to one of twelve different programmed states can store 3½ units of data. A memory cell that can be programmed to one of thirteen different programmed states can store 3⅝ units of data. A memory cell that can be programmed to one of fourteen different programmed states can store 3¾ units of data. A memory cell that can be programmed to one of fifteen different programmed states can store 3⅞ units of data. A memory cell that can be programmed to one of sixteen different programmed states can store 3½ or 4 units of data.

For some memory devices, the lowermost programmed state storable on a particular memory cell can be referred to as an erased state because the cell can be in a lowermost state after an erase operation. A number of programming operations may be performed in order to charge the cell to a higher Vt level. Thus, in the illustration of FIG. 2, the lowermost programmed state for each column appears below a horizontal line, indicating that it could be an erased state. However, this illustration is merely an example and embodiments of the present disclosure are not limited to cells having a lowermost state as an erased state.

A memory cell that can be programmed to one of two programmed states can store one unit of data, which can be represented in binary as a 0 and a 1. A memory cell that can be programmed to one of four programmed states can store two units of data, which can be represented in binary as 00, 01, 10, or 11. However, column 230 indicates a memory cell that can be programmed to one of six programmed states and can store 2½ units of data, which does not correspond directly to binary. That is, there is no binary numerical representation of data stored in a single 2½ bit cell. However, binary data stored in a group of cells, individually storing a fractional number of bits, can be numerically represented in binary. Cells storing a fractional number of bits can be read as a group in combination with, at least, a number of cells corresponding to the inverse of a fractional remainder of the number of bits stored. For example, two 2½ bit cells could be read together to produce a 5 bit output, and four 3¼ bit cells could be read together to produce a 13 bit output. Further discussion of such considerations for operating memory cells storing fractional bits of data can be found in U.S. Pat. No. 7,848,142 to Radke issued Dec. 7, 2010.

As is illustrated in FIG. 2, the threshold voltage distribution, i.e., the range of voltages within a particular Vt level, can decrease proportional to an increasing number of Vt levels stored in a particular memory cell with a given voltage range. For example, if a cell has a 0V-1V voltage range and can store 2 programmed states, a larger range of voltages can be available for each Vt level, e.g., 0.5V. However, if the same cell stores 10 programmed states, a smaller range of voltages can be available for each Vt level, e.g., 0.1V. Portions of a voltage range for a multilevel cell can be reserved for differentials between Vt levels to improve programming and/or sensing accuracy, among other reasons. The programmed states, e.g., Vt levels, for a particular cell can be numbered. For example, the six programmed states for a 2½ bit cell can be numbered 0, 1, 2, 3, 4, and 5, as shown in column 230.

FIGS. 3A-4B illustrate Cartesian coordinate graphs showing valid combinations of programmed states for a group of memory cells in accordance with a number of embodiments of the present disclosure. FIGS. 3A-4B include valid combinations of programmed states for a group of G number of memory cells, e.g., two memory cells, each being programmable to one of M number of programmed states. Specifically, in FIG. 3A, M is equal to four, in FIG. 3B, M is equal to eight, in FIG. 4A, M is equal to three, and in FIG. 4B, M is equal to six. A first axis, e.g., the x-axis, shows the M number of programmed states, e.g., programmed states 0-3 in FIGS. 3A and 4A, and programmed states 0-7 in FIGS. 3B and 4B, for a first memory cell ("Cell 1") of the group. A second axis, e.g., the y-axis, shows the M number of programmed states, e.g., programmed states 0-3 in FIGS. 3A and 4A, and programmed states 0-7 in FIGS. 3B and 4B, for a second memory cell ("Cell 2") of the group. The valid combinations of programmed states between the two memory cells are indicted by points on the Cartesian coordinate graphs. The total number of points, e.g., including valid and invalid points, on the graphs is equal to $M^G$ number of points, where G is equal to the number of memory cells in the group. The number of valid points is equal to $2^N$ number of points, where N is equal to the number of units of data stored in the group of memory cells.

Figure 3A:
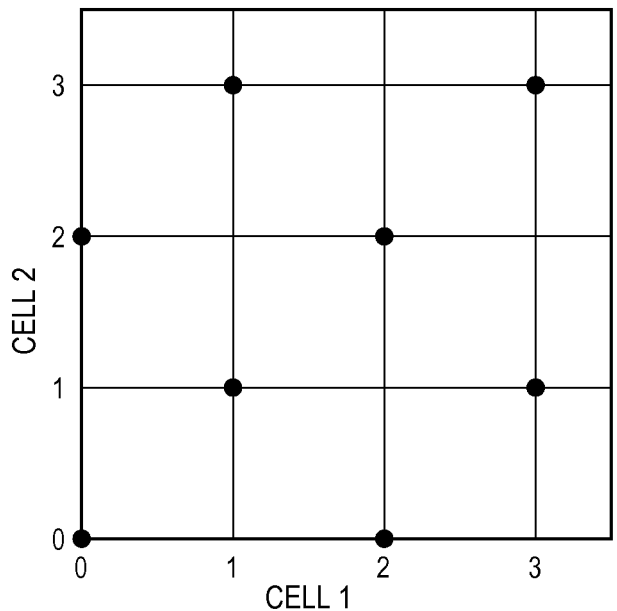
FIGS. 3A-4B illustrate Cartesian coordinate graphs showing valid combinations of programmed states for a group of memory cells in accordance with a number of embodiments of the present disclosure.

FIG. 3A shows a Cartesian coordinate graph 304A for a group of two memory cells that can store 3 units, e.g., bits, of data collectively, e.g., 1½ bits/cell, with four possible programmed states per cell. Thus, the graph 304A forms a 4×4 "constellation" of $M^G$ number of points with eight ($2^N$) of those points being valid. Valid points are represented in FIG. 3A by dots, while invalid points are represented without marking.

A number of embodiments of the present disclosure can include allowing programming of a group of G number of memory cells only to the $2^N$ number of valid combinations of programmed states. A minimum number of programmed states needed to store N units of data in a group of G number of memory cells is $ceil(2^{(N/G)})$. As will be appreciated, "ceil" rounds up to a next integer. Thus, according to some previous approaches to storing a non-integer number of units of data per memory cell, storing three units of data in two memory cells (1½ units per cell) may have been achieved by programming each memory cell to one of three programmed states $(ceil(2^{(3/2)})=3)$. However, as illustrated in FIG. 3A, each memory cell of the group can be programmed to one of four programmed states, which is a number of programmed states greater than the minimum number needed to store N/G (1½) units of data in one memory cell. According to a number of embodiments of the present disclosure, and as illustrated in FIG. 3A, each memory cell of a group of memory cells can be programmed to any one of M number of programmed states, where M is equal to $2^{ceil(N/G)}$, e.g., $2^{ceil(3/2)}=4$ in FIG. 3A.

A valid combination exists for each possible programmed state for each memory cell, e.g., the first and the second memory cells can be programmed to any one of states 0-3. However, not all combinations of programmed states for both memory cells are valid. For example, in the embodiment illustrated in FIG. 3A, the combinations {(0,0), (2,0), (1,1), (3,1), (0,2), (2,2), (1,3), and (3,3)} are valid while the combinations {(1,0), (3,0), (0,1), (2,1), (1,2), (3,2), (0,3), and (2,3)} are invalid. Such valid/invalid combinations can be assigned by control circuitry, e.g., either as fixed valid/invalid combinations, or as a programmable option.

Furthermore, other valid/invalid combinations can be assigned and embodiments are not limited to the specific examples illustrated herein.

In a number of embodiments, programming of the group of G number of memory cells can be restricted to those combinations of programmed states that have a normalized distance of less than $$\frac{1}{M}\sqrt{2}$$

therebetween, where the normalized distance is defined as a distance between a first point representing a first combination of programmed states and a second point representing a second combination of programmed states on the Cartesian coordinate graph 304A. As described herein, the combinations can be represented as points according to a number associated with the programmed state of each memory cell of the group. For example, the point (1,3) indicates that the first memory cell is programmed to a programmed state associated with the number one and the second memory cell is programmed to a programmed state associated with the number three. As described herein, the four programmed states are associated with a number from zero to three, however embodiments are not limited to this numbering convention. In this example, 1/M is the normalizing factor. A normalized distance means that the distance is normalized for a range of charges, e.g., voltages, to which memory cells are programmed for a particular memory device. Dividing the distance by the number of programmed states normalizes the distance for any range of charges so that a meaningful comparison can be had between devices that program memory cells to different ranges of charges. For example, a distance between the valid point (0,0) and the valid point (1,1) is equal to $\sqrt{2}$. The normalized distance is equal to $$\frac{1}{4}\sqrt{2}.$$

Thus, it is clear that it (0,0) is a valid point, (1,0) cannot also be a valid point because the normalized distance between those points would be ¼, which is less than $$\frac{1}{4}\sqrt{2}.$$

Programming each of the group of memory cells to one of a greater number of programmed states than the minimum number needed to store N/G units of data in each memory cell can allow for a greater number of invalid combinations of programmed states in the constellation for the group of memory cells. Such embodiments can allow for flexible modulation algorithms and more dense packing of the constellation space, e.g., having valid combinations that are more evenly distributed across the ranges of programmed states and/or charges stored in the memory cells of the group. Such embodiments can also provide for an improvement in soft read capabilities of a memory device. For example, having increased space between valid combinations of programmed states can provide a greater cushion for variations in a charge stored in a particular memory cell over time, e.g., due to charge leakage. That is, the charge stored on the particular memory cell can vary to a greater magnitude before it begins to correspond to a different programmed state. Such embodiments can also provide a memory device with an ability to output erasure information, e.g., because, in some examples, only half of the possible points (combinations of programmed states) are valid.

N units of data can be modulated to a combination of programmed states. After valid combinations of programmed states for a group of memory cells have been assigned, data unit values can be associated with the combinations of programmed states. For example, three units of data can be modulated to the combinations of programmed states illustrated in FIG. 3A according to the following associations of data unit values and combinations of programmed states: {(0,0):000; (2,0):001; (1,1):010; (3,1):011; (0,2):100; (2,2):101; (1,3):110; and (3,3):111 }. The present disclosure is not limited to the preceding example of associations, as the data unit values can be associated in another manner. According to this example, a controller of a memory device can be configured to program a first cell of a two cell group to programmed state 3 and a second cell to programmed state 1 to represent the binary value 011. Embodiments are not so limited.

According to a number of embodiments of the present disclosure, a programmed state of each memory cell of a group of G number of memory cells can be determined as one of the M number of programmed states during a sensing operation. The combination of programmed states of the memory cells of the group can be demodulated to N units of data, e.g., according to the associations between data unit values and combinations of programmed states that are assigned as described herein. As described herein, the N units of data can be error encoded data, e.g., data encoded with error information. In such instances, the combination of programmed states can be demodulated to N units of error encoded data without decoding the error encoded data. Subsequent to the demodulation, the N units of error encoded data can be decoded, e.g., using error circuitry.

In a number of embodiments of the present disclosure, demodulating the combination of programmed states can include mapping the combination of programmed states to a closest valid combination, e.g., where only $2^N$ number of combinations of programmed states out of a total possible $M^G$ number of combinations are valid, as described herein. Such mapping can include determining a charge stored in each memory cell of the group, e.g., via a soft data read, and determining the closest valid combination as a combination having a minimum value for:

$$\sqrt{(dc_1-vc_1)^2+(dc_2-vc_2)^2},$$

across the valid combinations of programmed states, where $dc_1$ is a determined charge of a first memory cell of the group; $dc_2$ is a determined charge for a second memory cell of the group; $vc_1$ is a valid charge for a first memory cell of a valid combination of memory cells; and $vc_2$ is a valid charge for a second memory cell of the valid combination of memory cells. Embodiments that allow programming each memory cell of the group to one of M number of programmed states, where M is greater than the minimum number needed to store N/G units of data in one memory cell, can provide for more robust mapping of combinations of programmed states to a closest valid combination because more space exists between valid combinations of programmed states than would otherwise exist if each memory cell of the group were programmed to one of M number of programmed states, where M was the minimum number needed to store N/G units of data in each memory cell. The closest valid combination can also be determined across more than two dimensions by extending the formula given above to the appropriate number of dimensions.

Each of the programmed states can correspond to a charge stored on the respective memory cell. Accordingly, programming a memory cell can include storing a charge in the memory cell, where each stored charge corresponds to N/G units of data. In some instances, N/G can be a non-integer number. Likewise, sensing a memory cell can include sensing a charge stored in the memory cell.

In a number of embodiments, data can be encoded with error information, e.g., such that the N units of data comprise error encoded data, before the data is modulated and programmed to a group of memory cells. Then the N units of error encoded data can be programmed to the group of memory cells without further error encoding. Likewise, the N units of error encoded data can be programmed to the group of memory cells without programming additional error information for the N units of error encoded data. Some previous approaches to storing a non-integer number of bits in a memory cell may have included packing the data, e.g., assigning N units of data to a set of G number of memory cells, to be programmed into sets of memory cells prior to encoding the data with error information, e.g., with error circuitry such as an inner error correction code (ECC) encoder. The error information, e.g., ECC parity information, could then be packed along with the N units of data as an expanded amount of data, e.g., an integer number of bits. In contrast, a number of embodiments of the present disclosure can provide a more effective code rate for error encoding the data by encoding the data before it is modulated into G number of memory cell groups, e.g., due to shorter codeword lengths.

For those embodiments storing a number of units per memory cell with a fractional remainder of ½, e.g., 2½ units per cell, the number of programmed states to which each cell of a group can be programmed can be divided into even and odd sets {E,O}, e.g., where 0 is considered to be even. For example, with respect to FIG. 3A, the sets can be represented as {[0 2], [1 3]}. The constellation can be described as {EE, EO, OO, OE}, e.g., for a group including two memory cells. For example, with respect to FIG. 3A, the constellation can be represented as {[00 02 20 22], [01 03 21 23], [11 13 31 33], [10 12 30 32]}, where the first digit represents a programmed state of the first memory cell and the second digit represents a programmed state of the second memory cell, e.g., "01" indicates that the first memory cell is in programmed state 0 while the second memory cell is in programmed state 1. Half of the constellation, e.g., {EE, OO} can be assigned to achieve the desired fractional remainder of units per memory cell as valid combinations. For example, with respect to FIG. 3A, the assignment can include {[00 02 20 22], [11 13 31 33]}. As will be appreciated, this representation of the valid combinations corresponds to the valid combinations described more specifically above, with respect to FIG. 3A, as, "{(0,0), (2,0), (1,1), (3,1), (0,2), (2,2), (1,3), and (3,3)}."

For those embodiments storing a number of units per memory cell with a fractional remainder of ¾, e.g., 3¾ units per cell, the constellation can be described as {AA, AB, AC, AD; BA, BB, BC, BD; CA, CB, CC, CD; DA, DB, DC, DD}, where {EE, EO, OO, OE}={A, B, C, D}, thus "AA," for example, represents the programmed states of a group of four memory cells. Half of the constellation can be assigned as valid combinations, e.g., {AA, AC; BB, BD; CA, CC; DB, DD}. For the case of a fractional remainder of units equal to ⅔, half of the valid combinations for the ¾ case can be assigned, e.g., {AA, AC; CA, CC}. For the case of a fractional remainder of units equal to ¼, half of the valid combinations for the ¾ case can be assigned, e.g., {AA, CC}. Each assignment can be made such that the distance between valid points (e.g., on a graph) is maximized. The description of the constellation can be extended for memory cells with a fractional remainder of units equal to ⅛, ⅜, ⅝, ⅞, etc.

Figure 3B:
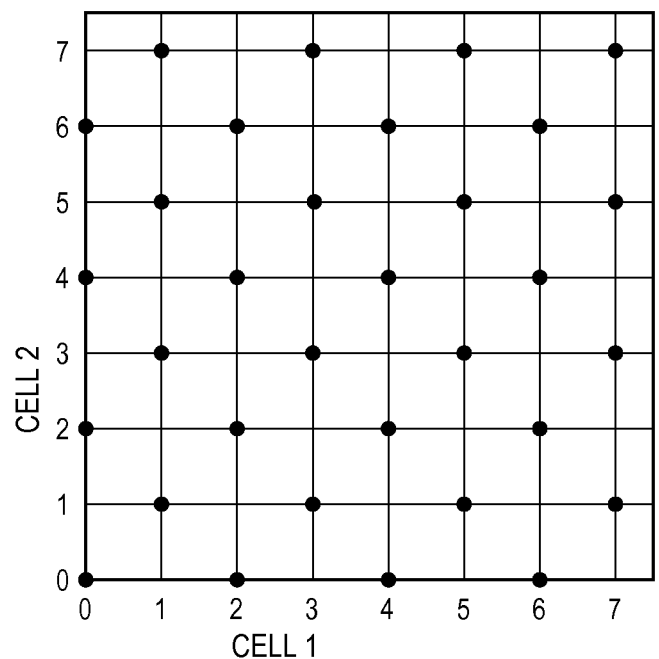

FIG. 3B shows a Cartesian coordinate graph 304B for a group of two memory cells that can store 5 units, e.g., bits, of data collectively, e.g., 2½ bits/cell, with eight possible programmed states per cell. Thus, the graph 304B forms an 8×8 "constellation" of $M^G$ number of points with 32 ($2^N$) of those points being valid. Valid points are represented in FIG. 3B by dots, while invalid points are represented without marking. As illustrated in FIG. 3B, each memory cell of the group can be programmed to one of eight programmed states, which is a number of programmed states greater than the minimum number needed to store N/G (2½) units of data in one memory cell. According to a number of embodiments of the present disclosure, and as illustrated in FIG. 3B, each memory cell of a group of memory cells can be programmed to any one of M number of programmed states, where M is equal to $2^{ceil(N/G)}$, e.g., $2^{ceil(5/2)}=8$ in FIG. 3B.

A valid combination exists for each possible programmed state for each memory cell, e.g., the first and the second memory cells can be programmed to any one of states 0-7. However, not all combinations of programmed states for both memory cells are valid. For example, in the embodiment illustrated in FIG. 3B, the combinations {(0,0), (2,0), (4,0), (6,0), (1,1), (3,1), (5,1), (7,1), (0,2), (2,2), (4,2), (6,2), (1,3), (3,3), (5,3), (7,3), (0,4), (2,4), (4,4), (6,4), (1,5), (3,5), (5,5), (7,5), (0,6), (2,6), (4,6), (6,6), (1,7), (3,7), (5,7), and (7,7)} are valid while the combinations {(1,0), (3,0), (5,0), (7,0), (0,1), (2,1), (4,1), (6,1), (1,2), (3,2), (5,2), (7,2), (0,3), (2,3), (4,3), (6,3), (1,4), (3,4), (5,4), (7,4), (0,5), (2,5), (4,5), (6,5), (1,6), (3,6), (5,6), (7,6), (0,7), (2,7), (4,7), and (6,7)} are invalid. Such valid/invalid combinations can be assigned by control circuitry, e.g., either as fixed valid/invalid combinations, or as a programmable option. Furthermore, other valid/invalid combinations can be assigned and embodiments are not limited to the specific examples illustrated herein.

In a number of embodiments, programming of the group of G number of memory cells can be restricted to those combinations of programmed states that have a normalized distance of less than $$\frac{1}{M}\sqrt{2}$$

therebetween, where the normalized distance is defined as a distance between a first point representing a first combination of programmed states and a second point representing a second combination of programmed states on the Cartesian coordinate graph 304B. The eight programmed states are associated with a number from zero to seven, however embodiments are not limited to this numbering convention. A distance between the valid point (0,0) and the valid point (1,1) is equal to $\sqrt{2}$. The normalized distance is equal to $$\frac{1}{8}\sqrt{2}.$$

Thus, it is clear that if (0,0) is a valid point, that (1,0) cannot also be a valid point because the normalized distance between those points would be ⅛, which is less than $$\frac{1}{8}\sqrt{2}.$$

Comparing FIG. 3B to FIG. 3A illustrates how using a normalized distance can aid in understanding valid combinations of programmed states. For example, it is clear that the distance between points (0,0) and (1,1) is different in FIG. 3A than it is in FIG. 3B, e.g., even if the first and the second memory cells in FIG. 3A are capable of storing a range of charges corresponding to programmed states 0-3 that is equal to a range of charges corresponding to programmed states 0-7 for the first and the second memory cells in FIG. 3B. However, the normalized distance between points (0,0) and (1,1) in FIG. 3A and FIG. 3B is equal.

N units of data can be modulated to a combination of programmed states. After valid combinations of programmed states for a group of memory cells have been assigned, data unit values can be associated with the combinations of programmed states. For example, five units of data can be modulated to the combinations of programmed states illustrated in FIG. 3B according to the following associations of data unit values and combinations of programmed states: {(0,0):00000; (2,0):00001; (4,0):00010; (6,0):00011; (1,1):00100; (3,1):00101; (5,1):00110; (7,1):00111; (0,2):01000; (2,2):01001; (4,2):01010; (6,2):01011; (1,3):01100; (3,3):01101; (5,3):01110; (7,3):01111; (0,4):10000; (2,4):10001; (4,4):10010; (6,4):10011; (1,5):10100; (3,5):10101; (5,5):10110; (7,5):10111; (0,6):11000; (2,6):11001; (4,6):11010; (6,6):11011; (1,7):11100; (3,7):11101; (5,7):11110; and (7,7):11111}. The present disclosure is not limited to the preceding example of associations, as the data unit values can be associated in another manner. According to this example, a controller of a memory device can program a first cell of a two cell group to programmed state 3 and a second cell to programmed state 1 to represent the binary value 00101. Embodiments are not so limited.

Figure 4A:
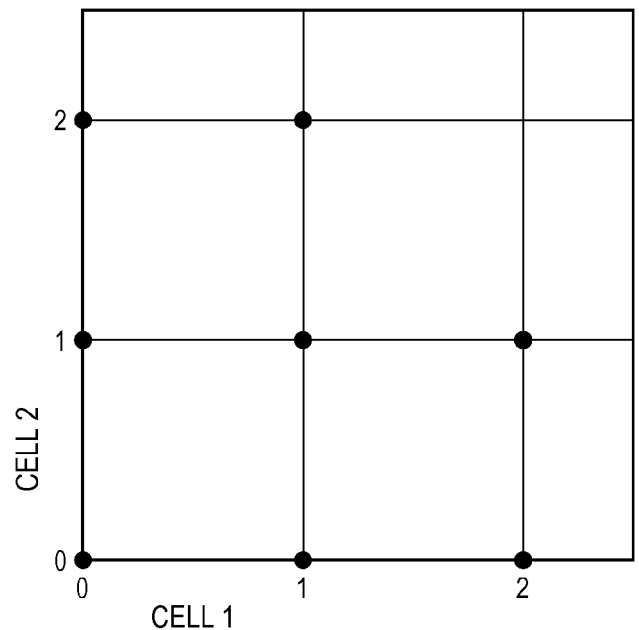

FIG. 4A shows a Cartesian coordinate graph 404A for a group of two memory cells that can store 3 units, e.g., bits, of data collectively, e.g., 1½ bits/cell, with three possible programmed states per cell. Thus, the graph 404A forms a 3×3 "constellation" of $M^G$ number of points with eight ($2^N$) of those points being valid. Valid points are represented in FIG. 4A by dots, while invalid points are represented without marking.

A number of embodiments of the present disclosure can include allowing programming of a group of G number of memory cells only to the $2^N$ number of valid combinations of programmed states. In the embodiment illustrated in FIG. 4A, a minimum number of programmed states needed to store N units of data in a group of G number of memory cells is ceil($2^{(N/G)}$) and each memory cell of the group can be programmed to one of three programmed states, which is a number of programmed states equal to the minimum number needed to store N/G (1½) units of data in one memory cell. According to a number of embodiments of the present disclosure, and as illustrated in FIG. 4A, each memory cell of a group of memory cells can be programmed to any one of M number of programmed states, where M is equal to ceil($2^{(N/G)}$), e.g., ceil($2^{(3/2)}$)=3 in FIG. 4A.

A valid combination exists for each possible programmed state for each memory cell, e.g., the first and the second memory cells can be programmed to any one of states 0-2. However, not all combinations of programmed states for both memory cells are valid. For example, in the embodiment illustrated in FIG. 4A, the combinations {(0,0), (1,0), (2,0), (0,1), (1,1), (2,1), (0,3), and (1,3)} are valid while the combination (3,3) is invalid. Thus, a number of embodiments of the present disclosure can allow programming only to the $2^N$ number of combinations having a least charge associated therewith, e.g., the invalid combination (3,3) represents a greatest combined magnitude of charge between the first and the second memory cell of the group and is therefore invalid. Such embodiments can avoid higher charge levels, which require more power during programming and may contribute to capacitive coupling, crosstalk, and/or other negative side effects of storing a relatively high charge on a number of memory cells. The minimum normalized distance between any two valid points in the embodiment illustrated in FIG. 4 is 1/M. Such valid/invalid combinations can be assigned by control circuitry, e.g., either as fixed valid/invalid combinations, or as a programmable option. Furthermore, other valid/invalid combinations can be assigned and embodiments are not limited to the specific examples illustrated herein.

N units of data can be modulated to a combination of programmed states. After valid combinations of programmed states for a group of memory cells have been assigned, data unit values can be associated with the combinations of programmed states. For example, three units of data can be modulated to the combinations of programmed states illustrated in FIG. 4A according to the following associations of data unit values and combinations of programmed states: {(0,0) : 000; (1,0) : 001; (2,0) : 010; (0,1) : 011; (1,1) : 100; (2,1) : 101; (0,3) : 110; and (1,3) : 111}. The present disclosure is not limited to the preceding example of associations, as the data unit values can be associated in another manner. According to this example, a controller of a memory device can program a first cell of a two cell group to programmed state 0 and a second cell to programmed state 1 to represent the binary value 011. Embodiments are not so limited.

Prior to modulating and/or programming data, the data can be encoded with error information, e.g., using error circuitry such as circuitry that implements ECC. Thus, the N units of data that are modulated and programmed, as describe above, can comprise N units of error encoded data. The N units of error encoded data can be programmed to the group without programming additional error data for the N units of error encoded data. Such embodiments can provide for an increased ECC capability due to a shorter codeword length as described herein. Furthermore, such embodiments can provide for quicker ECC encoding.

According to a number of embodiments of the present disclosure, a programmed state of each memory cell of a group of G number of memory cells can be determined as one of the M number of programmed states during a sensing operation. The combination of programmed states of the memory cells of the group can be demodulated to N units of error encoded data, e.g., according to the associations between data unit values and combinations of programmed states that are assigned as described herein. The N units of error encoded data then can be decoded, e.g., using error circuitry.

In a number of embodiments of the present disclosure, demodulating the combination of programmed states can include mapping the combination of programmed states to a closest valid combination, e.g., where only $2^N$ number of combinations of programmed states out of a total possible $M^G$ number of combinations are valid, as described herein. Such mapping can include determining a charge stored in each memory cell of the group, e.g., via a soft data read, and determining the closest valid combination as a combination having a minimum distance between a point representing the combination of the charges stored in each memory cell of the group and a number of points representing valid combinations of programmed states as represented on a Cartesian coordinate graph 404A having charges corresponding to the M number of programmed states for a first memory cell of the group as a first axis and charges corresponding to the M number of programmed states for a second memory cell of the group as a second axis.

Figure 4B:
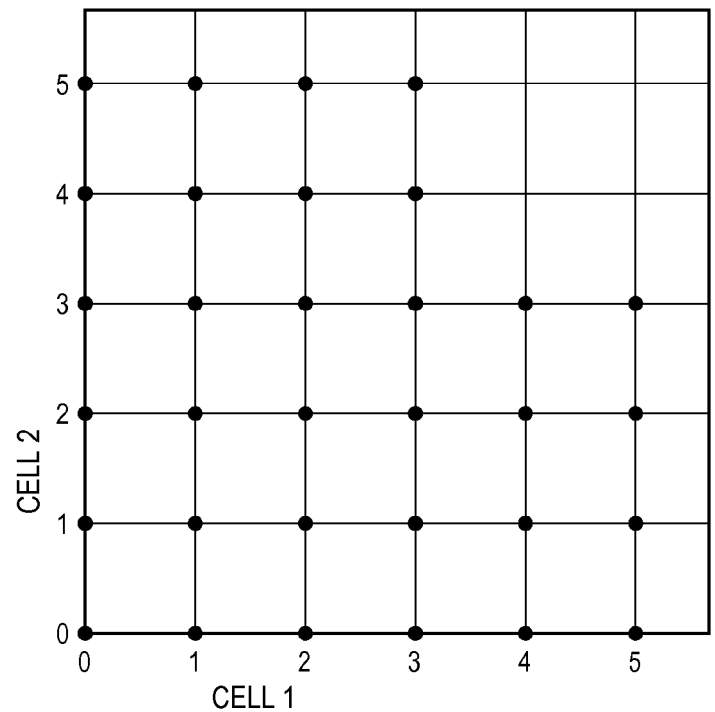

FIG. 4B shows a Cartesian coordinate graph 404B for a group of two memory cells that can store 5 units, e.g., bits, of data collectively, e.g., 2½ bits/cell, with six possible programmed states per cell. Thus, the graph 404B forms a 6×6 "constellation" of $M^G$ number of points with 32 ($2^N$) of those points being valid. Valid points are represented in FIG. 4B by dots, while invalid points are represented without marking. As illustrated in FIG. 4B, each memory cell of the group can be programmed to one of M number of programmed states, where M is equal to ceil($2^{(N/G)}$), e.g., ceil($2^{(3/2)}$)=6 in FIG. 4B.

A valid combination exists for each possible programmed state for each memory cell, e.g., the first and the second memory cells can be programmed to any one of states 0-5. However, not all combinations of programmed states for both memory cells are valid. For example, in the embodiment illustrated in FIG. 4B, the combinations {(0,0), (1,0), (2,0), (3,0), (4,0), (5,0), (0,1), (1,1), (2,1), (3,1), (4,1), (5,1), (0,2), (1,2), (2,2), (3,2), (4,2), (5,2), (0,3), (1,3), (2,3), (3,3), (4,3), (5,3), (0,4), (1,4), (2,4), (3,4), (0,5), (1,5), (2,5), and (3,5)} are valid while the combinations {(4,4), (5,4), (4,5), and (5,5)} are invalid. Thus, a number of embodiments of the present disclosure can allow programming only to the $2^N$ number of combinations having a least charge associated therewith, e.g., the invalid combinations {(4,4), (5,4), (4,5), and (5,5)} represent the $M^G - 2^N$ combinations that have a greatest combined magnitude of charge between the first and the second memory cells of the group and are therefore invalid. The minimum normalized distance between any two valid points in the embodiment illustrated in FIG. 4 is 1/M. Such valid/invalid combinations can be assigned by control circuitry, e.g., either as fixed valid/invalid combinations, or as a programmable option. Furthermore, other valid/invalid combinations can be assigned and embodiments are not limited to the specific examples illustrated herein.

N units of data can be modulated to a combination of programmed states. After valid combinations of programmed states for a group of memory cells have been assigned, data unit values can be associated with the combinations of programmed states. For example, five units of data can be modulated to the combinations of programmed states illustrated in FIG. 4B according to the following associations of data unit values and combinations of programmed states: {(0,0):00000; (1,0):00001; (2,0):00010; (3,0):00011; (4,0):00100; (5,0):00101; (0,1):00110; (1,1):00111; (2,1):01000; (3,1):01001; (4,1):01010; (5,1):01011; (0,2):01100; (1,2):01101; (2,2):01110; (3,2):01111; (4,2):10000; (5,2):10001; (0,3):10010; (1,3):10011; (2,3):10100; (3,3):10101; (4,3):10110; (5,3):10111; (0,4):11000; (1,4):11001; (2,4):11010; (3,4):11011; (0,5):11100; (1,5):11101; (2,5):11110; and (3,5):11111}. The present disclosure is not limited to the preceding example of associations, as the data unit values can be associated in another manner. According to this example, a controller of a memory device can program a first cell of a two cell group to programmed state 0 and a second cell to programmed state 1 to represent the binary value 00110. Embodiments are not so limited.

The following table includes relationships between the number of units stored per cell (U/C) and the number of programmed (pgm) states per cell and packing gain in distance represented in decibels (dB) for some previous approaches ("Pre"), ("Square") embodiments of the present disclosure, such as those that provide a minimum normalized distance of $\sqrt{2}$ between valid points, e.g., as is described with respect to FIGS. 4A-4B, and("Cross") embodiments of the present disclosure, such as those that provide a minimum normalized distance of $$\frac{1}{M}\sqrt{2}$$

between valid points, e.g., such as is described with respect to FIGS. 3A-3B. The packing gain is represented in decibels because it indicates an increased noise immunity between programmed states, e.g., as described herein with respect to increased soft read capabilities.

|  | Pgm states per cell | | | Packing gain (dB) | | |
| --- | --- | --- | --- | --- | --- | --- |
| U/C | Pre | Square | Cross | Pre | Square | Cross |
| 1.5 | 3 | 3 | 4 | 0 | 0 | 0.51 |
| 2.5 | 6 | 6 | 8 | 0 | 0 | 0.51 |
| 3.125 | 9 | 9 | 16 | 0 | 0 | 1.02 |
| 3.25 | 10 | 10 | 16 | 0 | 0 | 1.94 |
| 3.375 | 11 | 11 | 16 | 0 | 0 | 2.77 |
| 3.5 | 12 | 12 | 16 | 0 | 0 | 0.51 |
| 3.625 | 13 | 13 | 16 | 0 | 0 | 1.21 |
| 3.75 | 14 | 14 | 16 | 0 | 0 | 1.85 |
| 3.875 | 15 | 15 | 16 | 0 | 0 | 2.45 |

Figure 5:
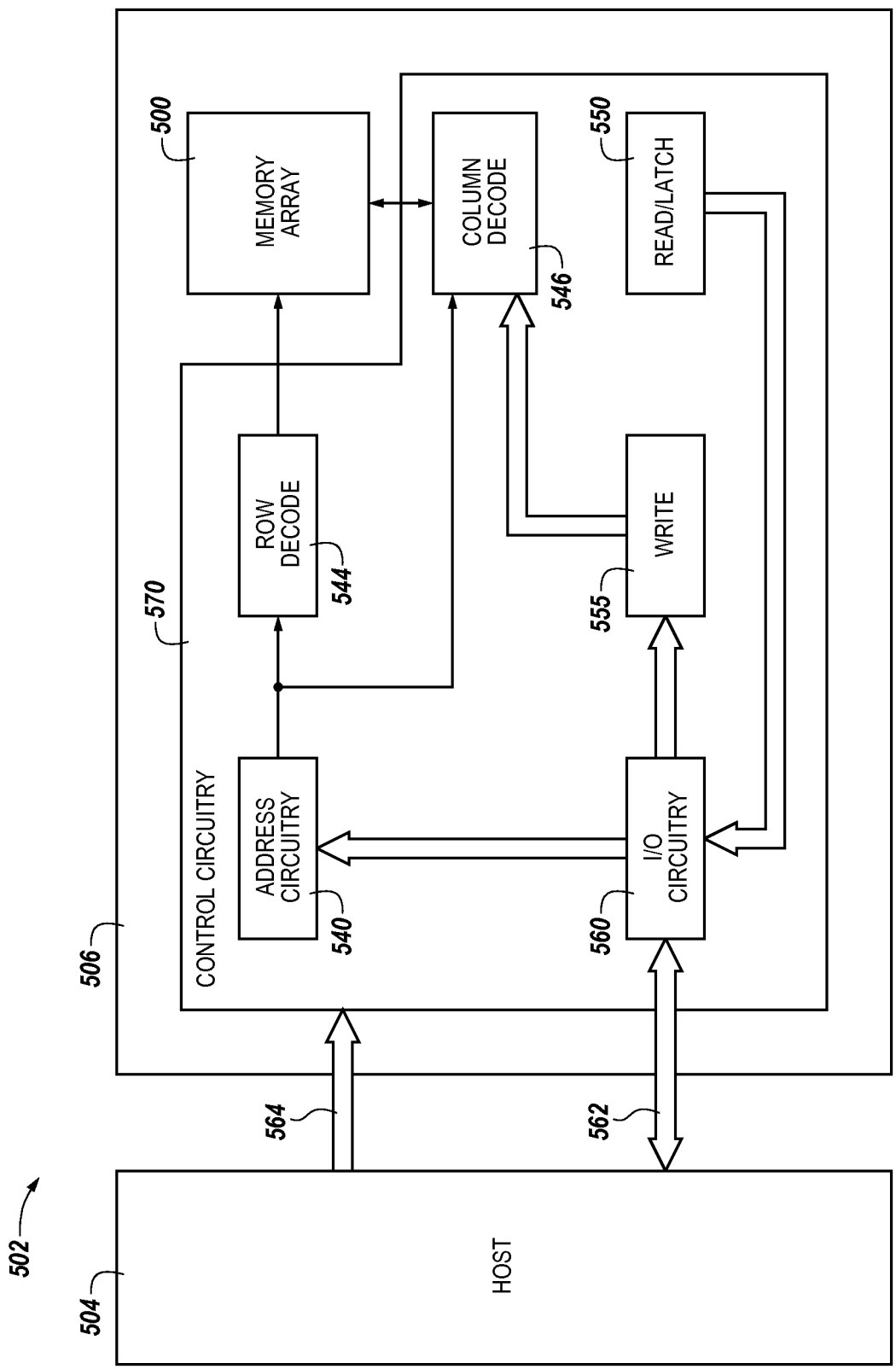
FIG. 5 illustrates a block diagram of an electronic memory system having a memory device operated in accordance with a number of embodiments of the present disclosure.

FIG. 5 illustrates a block diagram of an electronic memory system 502 having a memory device 506 operated in accordance with a number of embodiments of the present disclosure. The memory system 502 includes a host 504, e.g., a processor, a computing device including a number of processors, an application specific integrated circuit (ASIC), etc., coupled to the memory device 506. The memory device 506 includes a memory array 500. The memory array 500 can be analogous to the memory array 100 previously described in connection with FIG. 1. Although one memory array 500 is shown in FIG. 5, embodiments of the present disclosure are not so limited, e.g., the memory device 506 can include more than one memory array 500.

The memory device 506 includes an array 500 of memory cells, which can be floating gate flash memory cells with a NAND architecture, as previously described herein. The control circuitry 570 includes address circuitry 540 to latch address signals provided over I/O connections 562 through I/O circuitry 560. Address signals are received and decoded by a row decoder 544 and a column decoder 546 to access the memory array 500. In light of the present disclosure, it will be appreciated by those skilled in the art that the number of address input connections depends on the density and architecture of the memory array 500 and that the number of addresses increases with both increased numbers of memory cells and increased numbers of memory blocks and arrays.

The memory device 506 includes control circuitry 570 coupled to the memory array 500. The control circuitry 570 can be configured to assign $2^N$ number of valid combinations out of $M^G$ number of possible combinations of programmed states to represent N units of data in a group of G number of memory cells, where each memory cell of the group is programmable to one of M number of programmed states, where N/G is a non-integer number. The control circuitry 570 can be configured to modulate N units of data to one of the valid combinations of programmed states, where M is equal to $2^{ceil(N/G)}$, in response to a first setting of a programmable option. The control circuitry 570 can be configured to modulate N units of data to one of the valid combinations of programmed states, where M is equal to ceil($2^{N/G}$), in response to a second setting of the programmable option.

The control circuitry 570 can sense data in the memory array 500 by sensing voltage and/or current changes in the memory array columns using sensing circuitry that in this embodiment can be read/latch circuitry 550. The read/latch circuitry 550 can read and latch a page, e.g., a row, of data from the memory array 500. I/O circuitry 560 is included for bi-directional data communication over the I/O connections 562 with the host 504. Write circuitry 555 is included to write data to the memory array 500.

The control circuitry 570 decodes signals provided by control connections 564 from the host 504. These signals can include chip signals, write enable signals, and address latch signals that are used to control the operations on the memory array 500, including data sensing, data write, and data erase operations, as described herein. In a number of embodiments, the control circuitry 570 is responsible for executing instructions from the host 504 to perform the operations according to embodiments of the present disclosure. The control circuitry 570 can be a state machine, a sequencer, or some other type of controller. It will be appreciated by those skilled in the art that additional circuitry and control signals can be provided, and that the memory device detail of FIG. 5 has been reduced to facilitate ease of illustration.

Conclusion

The present disclosure includes methods, devices, and systems for data modulation for groups of memory cells. One method for data modulation for groups of memory cells can include modulating N units of data to a combination of programmed states. Each memory cell of a group of G number of memory cells can be programmed to one of M number of programmed states, where M is greater than a minimum number of programmed states needed to store N/G units of data in one memory cell, and where the programmed state of each memory cell of the group comprises one of the combination of programmed states.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of of the associated listed items.

As used herein, the term "and/or" includes any and all combinations of a number of of the associated listed items. As used herein the term "or," unless otherwise noted, means logically inclusive or. That is, "A or B" can include (only A), (only B), or (both A and B). In other words, "A or B" can mean "A and/or B" or "a number of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for programming memory cells, comprising:
   modulating N units of data to a combination of programmed states; and
   programming each memory cell of a group of G number of memory cells to one of M number of programmed states, where M is equal to a number of programmed states to which control circuitry is configured to program each memory cell of the group, where M is greater than a minimum number of programmed states needed to store N/G units of data in one memory cell, and where the programmed state of each memory cell of the group comprises one of the combination of programmed states.

2. The method of claim 1, wherein programming each memory cell of the group includes programming the N units of data to the group, where M is equal to $2^{ceil(N/G)}$.

3. The method of claim 1, wherein programming each memory cell of the group includes storing a charge in each cell of the group, where each stored charge corresponds to N/G units of the data, and where N/G is a non-integer.

4. The method of claim 1, wherein the method includes encoding data with error information such that the N units of data comprise error encoded data, and wherein modulating the N units of data comprises modulating N units of error encoded data.

5. The method of claim 1, wherein the method includes allowing programming of the group of memory cells only to $2^N$ number of combinations of programmed states out of a total possible $M^G$ number of combinations of programmed states.

6. The method of claim 5, wherein the method includes restricting programming of a combinations of programmed states that have a normalized distance less than $$\frac{1}{M}\sqrt{2}$$

therebetween, wherein the normalized distance is defined as a distance between a first point representing a first combination of programmed states and a second point representing a second combination of programmed states on a Cartesian coordinate graph having the M number of programmed states for a first memory cell of the group as a first axis and the M number of programmed states for a second memory cell of the group as a second axis.

7. The method of claim 1, wherein:
modulating N units of data comprises modulating three units of data to a combination of programmed states; and
programming each memory cell of a group of G number of memory cells to one of M number of programmed states comprises programming each memory cell of a group of two memory cells to one of four programmed states, where at least three programmed states are needed to store 1.5 units of data in one memory cell.

8. The method of claim 1, wherein:
modulating N units of data comprises modulating five units of data to a combination of programmed states; and
programming each memory cell of a group of G number of memory cells to one of M number of programmed states comprises programming each memory cell of a group of two memory cells to one of eight programmed states, where at least six programmed states are needed to store 2.5 units of data in one memory cell.

9. The method of claim 4, wherein programming each memory cell of the group includes programming the N units of error encoded data to the group without programming additional error information for the N units of error encoded data.

10. A memory device, comprising:
an array of memory cells; and
control circuitry coupled to the array, wherein the control circuitry is configured to:
assign $2^N$ number of valid combinations out of $M^G$ number of possible combinations of programmed states to represent N units of data in a group of G number of memory cells, where each memory cell of the group is programmable to one of M number of programmed states, where M is equal to a number of programmed states to which control circuitry is configured to program each memory cell of the group, and where M is equal to $2^{ceil(N/G)}$, and where N/G is a non-integer number; and
modulate N units of data to one of the valid combinations of programmed states.

11. The device of claim 10, wherein $2^N$ is half of $M^G$.

12. The device of claim 10, wherein the control circuitry is configured to program each memory cell of the group to one of the M number of programmed states, where the programmed state of each memory cell of the group comprises a programmed state of the one of the valid combinations of programmed states.

13. The device of claim 10, wherein the control circuitry is configured to:
determine a programmed state of each memory cell of a group of G number of memory cells, where the programmed state of each memory cell of the group corresponds to one of a combination of programmed states; and
demodulate the combination of programmed states to N units of data.

14. The device of claim 10, wherein the control circuitry is configured to error encode data prior to modulation such that the N units of data comprise N units of error encoded data.

15. The device of claim 10, wherein M is greater than a minimum number of programmed states needed to store N/G units of data in one memory cell.

16. The device of claim 14, wherein the control circuitry is configured to program each memory cell of the group to one of M number of programmed states such that each cell of the group stores N/G non-integer units of the encoded data without further error encoding the N units of error encoded data.

17. The device of claim 14, wherein the control circuitry is configured to:
determine a programmed state of each memory cell of a group of G number of memory cells, where the programmed state of each memory cell of the group corresponds to one of a combination of programmed states; and
demodulate the combination of programmed states to N units of encoded data.

18. The device of claim 17, wherein the control circuitry is configured to decode the N units of encoded data subsequent to demodulating the combination of programmed states.

* * * * *